United States Patent [19]

Chang et al.

[11] Patent Number: 5,477,176
[45] Date of Patent: Dec. 19, 1995

[54] POWER-ON RESET CIRCUIT FOR PREVENTING MULTIPLE WORD LINE SELECTIONS DURING POWER-UP OF AN INTEGRATED CIRCUIT MEMORY

[75] Inventors: Ray Chang; Lawrence F. Childs; Kenneth W. Jones; Donovan Raatz; Stephen Flannagan, all of Austin, Tex.

[73] Assignee: Motorola Inc., Schaumburg, Ill.

[21] Appl. No.: 253,076

[22] Filed: Jun. 2, 1994

[51] Int. Cl.$^6$ ...................................................... H03L 7/00
[52] U.S. Cl. ............................. 327/143; 327/142; 327/198; 327/513
[58] Field of Search .................................... 327/142, 143, 327/198, 545, 546, 512, 513; 365/226, 230.03, 200

[56] References Cited

U.S. PATENT DOCUMENTS

| | | | |
|---|---|---|---|
| 3,895,239 | 7/1975 | Alaspa | 307/268 |
| 4,634,905 | 1/1987 | Campbell, Jr. | 307/594 |
| 4,886,984 | 12/1989 | Nakaoka | 307/272.3 |
| 4,900,950 | 2/1990 | Dubujet | 307/272.3 |
| 4,933,902 | 6/1990 | Yamada et al. | 365/189.08 |
| 5,073,874 | 12/1991 | Yamada et al. | 365/226 |
| 5,115,146 | 5/1992 | McClure | 327/143 |
| 5,130,569 | 7/1992 | Glica | 327/143 |
| 5,144,159 | 9/1992 | Frisch et al. | 307/272.3 |
| 5,149,987 | 9/1992 | Martin | 327/143 |
| 5,151,614 | 9/1992 | Yamazaki et al. | 307/272.3 |
| 5,177,375 | 1/1993 | Ogawa et al. | 307/272.3 |
| 5,212,412 | 5/1993 | Atriss et al. | 327/143 |
| 5,243,233 | 9/1993 | Cliff | 307/296.4 |
| 5,302,861 | 4/1994 | Jelinek | 327/198 |
| 5,321,317 | 6/1994 | Pascucci et al. | 327/143 |

*Primary Examiner*—Timothy P. Callahan
*Assistant Examiner*—Kenneth B. Wells
*Attorney, Agent, or Firm*—Daniel D. Hill

[57] ABSTRACT

A power-on reset circuit (30) for a memory (20) includes a DC model circuit (39), an $N_{BIAS}$ check circuit (64), and a NAND logic gate (71). A logic low power-on reset signal is provided at power-up of the memory (20) to establish initial conditions in a clock circuit (29) and in row and column predecoders/latches (24, 27). When the power supply voltage, a bandgap reference voltage, and a bias voltage all reach their predetermined voltages, the power-on reset circuit (30) provides a logic high power-on reset signal. In this manner, the power-on reset circuit (30) is assured of providing a logic low power-on reset signal until all of the proper voltage levels are reached. In addition, the power-on reset circuit models a DC circuit equivalent of an address buffer circuit (79) for compensating for process and temperature variations.

19 Claims, 6 Drawing Sheets

FIG.3 —PRIOR ART—

POWER-ON RESET CIRCUIT FOR PREVENTING MULTIPLE WORD LINE SELECTIONS DURING POWER-UP OF AN INTEGRATED CIRCUIT MEMORY

FIELD OF THE INVENTION

This invention relates generally to power-on reset circuits, and more particularly, to a power-on reset circuit for an integrated circuit memory.

BACKGROUND OF THE INVENTION

A power-on reset circuit, sometimes called a power-up clear circuit, is typically used to establish predetermined initial conditions in an integrated circuit while a power supply voltage provided to the integrated circuit increases to a voltage level necessary for proper operation of the integrated circuit. The power-on reset circuit provides a logic signal upon power-up to cause a circuit to power-up in a known state. When the power supply voltage reaches a predetermined voltage level, the power-on reset logic signal is deasserted, allowing the circuit to operate.

In some known power-on reset circuits, a resistive element and a capacitor are used to provide an RC (resistor-capacitor) time constant which is used to establish a relatively long time delay. The relatively long time delay is needed to allow for variations in power supply rise times, power supply transients, and process and temperature variations. The power-on reset signal is deasserted at the expiration of the time delay. However, in some situations, the power-on reset signal may be deasserted before the power supply voltage reaches the predetermined voltage level. For example, the assertion of the power-on reset signal in power-on reset circuits that use an RC time constant is generally dependent on the rise time of the power supply voltage. If the power supply voltage rise time is greater than the RC time constant, the power-on reset signal may be deasserted before the power supply voltage is at the proper level, and the integrated circuit may fail to operate properly.

In other known power-on reset circuits, the power-on reset signal is deasserted when the power supply voltage reaches a predetermined level, and the switching of the power-on reset signal is independent of the rise time of the power supply voltage. However, due to factors such as process and temperature variations, the power-on reset signal may be deasserted before the power supply voltage is at the predetermined level.

In an integrated circuit memory, if the power-on reset circuit is deasserted before an address buffer circuit is properly initialized, an output signal of the address buffer may be undetermined, making it possible for there to be multiple word line selections, resulting in unacceptably high array current.

SUMMARY OF THE INVENTION

Accordingly, there is provided, in one form, a power-on reset circuit for an integrated circuit having a first circuit, a second circuit and a logic gate. The first circuit is coupled between first and second power supply voltage terminals for receiving a power supply voltage and has an input terminal and an output terminal. The input terminal is for receiving a bias voltage. The first circuit representing a DC (direct current) circuit equivalent of a circuit of the integrated circuit. The second circuit has a first input terminal coupled to the output terminal of the first circuit, a second input terminal for receiving the bias voltage, and an output terminal. The logic gate has a first input terminal coupled to the output terminal of the first circuit, a second input terminal coupled to the output terminal of the second circuit, and an output terminal for providing a power-on reset signal. These and other features and advantages will be more clearly understood from the following detailed description taken in conjunction with the accompanying drawings.

DESCRIPTION OF A PREFERRED EMBODIMENT

Generally, the present invention provides a power-on reset circuit for a memory that provides a logic low power-on reset signal at power-up to establish initial conditions in selected circuits of an integrated circuit, such as an integrated circuit memory. The power-on reset circuit provides a logic high power-on reset signal when the power supply voltage, a bandgap reference voltage ($V_{BG}$), and a bias voltage ($N_{BIAS}$) all reach their predetermined voltage levels. By monitoring both the bandgap reference voltage and the bias voltage, in addition to the power supply voltage, the power-on reset circuit is assured of providing a logic low power-on reset signal until the various voltages provided to the integrated circuit are at the proper voltage levels. Also, the power-on reset signal is provided independent of the rise time of the power supply voltage. In addition, the power-on reset circuit models a DC circuit equivalent of an address buffer circuit of the integrated circuit memory in order to compensate for process and temperature variations which may affect the predetermined voltage at which the address buffer circuit operates.

Figure 1:
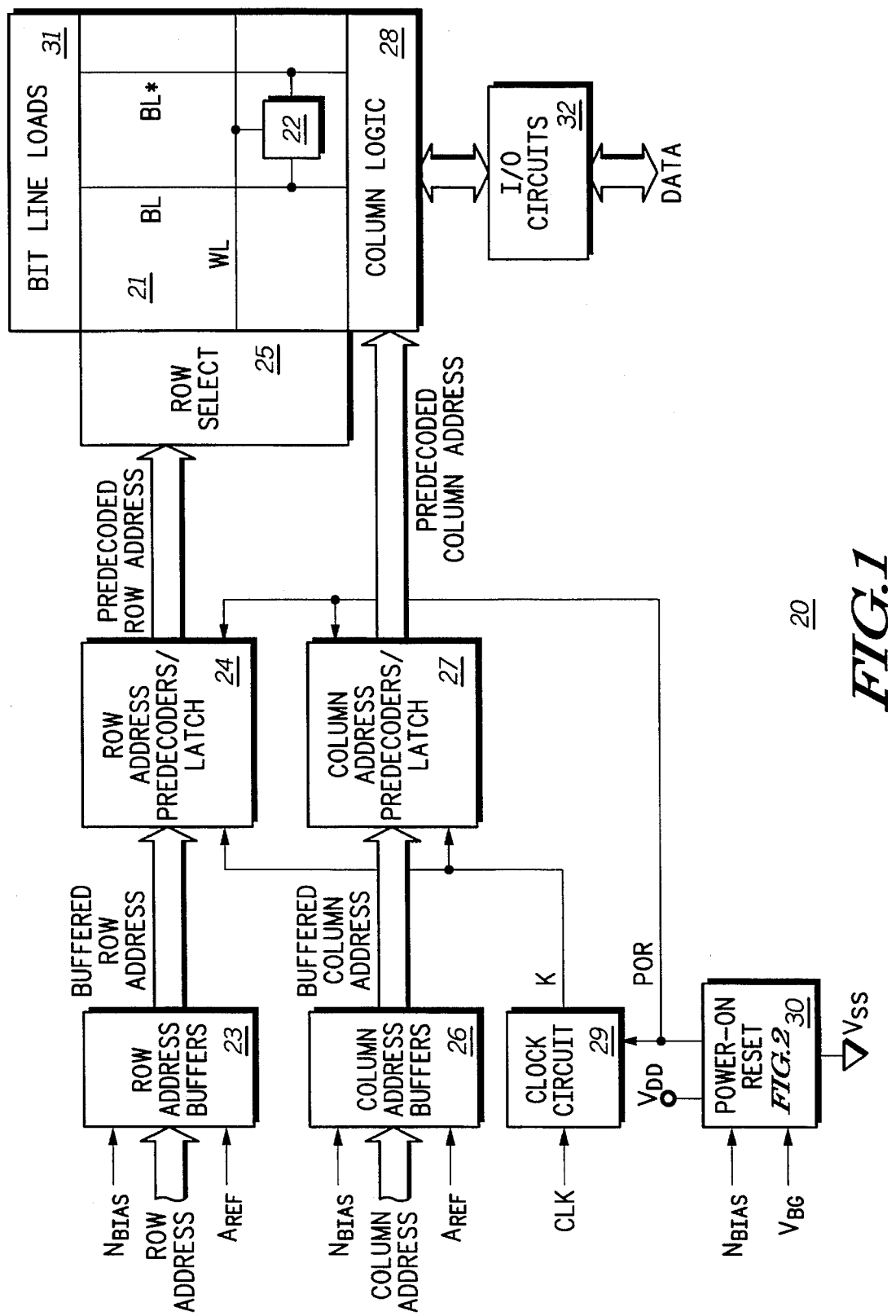
FIG. 1 illustrates in block diagram form, a memory in accordance with the present invention.

The present invention can be more fully described with reference to FIG. 1–FIG. 6. FIG. 1 illustrates in block diagram form, a memory in accordance with the present invention. Memory 20 is a synchronous integrated circuit SRAM implemented in BICMOS. A BICMOS integrated circuit is a circuit that includes bipolar transistors and CMOS (complementary metal-oxide semiconductor) transistors on the same integrated circuit. Memory 20 includes memory array 21, row address buffers 23, row address predecoders/latch 24, row select circuits 25, column address buffers 26, column address predecoders/latch 27, column logic 28, clock circuit 29, power-on reset circuit 30, bit line loads 31, and data input/output (I/O) circuits 32.

Memory array 21 includes a plurality of memory cells, such as memory cell 22, organized in rows and columns. A word line and the memory cells coupled to the word line comprise a row of memory cells. A bit line pair and the memory cells coupled to the bit line pair comprise a column of memory cells. Each memory cell is a conventional four transistor SRAM cell having polysilicon load resistors. However, the memory cells may also be six transistor SRAM cells using P-channel transistors as pull-up devices instead of polysilicon load resistors. A memory cell is located at each intersection of the word lines and the bit line pairs. For example, memory cell 22 is coupled to a word line labeled "WL", and to a bit line pair labeled "BL" and "BL*". Note that an asterisk (*) after a signal name indicates that the signal is a logical complement of a signal having the same name but lacking the asterisk (*). The memory cells of array 21 are addressable through row decoding and column decoding, and each memory cell has a unique address at an intersection of a row and a column. Each word line is coupled to row select circuits 25, and each bit line is coupled between bit line loads 31 and column logic 28.

Row address buffers 23 have a plurality of first input terminals for receiving a row address labeled "ROW ADDRESS", a second input terminal for receiving a bias voltage labeled "$N_{BIAS}$", a third input terminal for receiving a reference voltage labeled "$A_{REF}$", and a plurality of output terminals for providing buffered row address signals labeled "BUFFERED ROW ADDRESS". Row address predecoders/latch 24 has a plurality of first input terminals for receiving buffered row address signals BUFFERED ROW ADDRESS, a second input terminal, a third input terminal, and a plurality of output terminals for providing predecoded row address signals labeled "PREDECODED ROW ADDRESS".

Column address buffers 26 have a plurality of first input terminals for receiving a column address labeled "COLUMN ADDRESS", a second input terminal for receiving bias voltage $N_{BIAS}$, a third input terminal for receiving reference voltage $A_{REF}$, and a plurality of output terminals for providing buffered column address signals labeled "BUFFERED COLUMN ADDRESS". Column address predecoders/latch 27 has a plurality of first input terminals for receiving buffered column address signals BUFFERED COLUMN ADDRESS, a second input terminal, a third input terminal, and a plurality of output terminals for providing predecoded column address signals labeled "PREDECODED COLUMN ADDRESS". Note that the amount of decoding and predecoding may be different in other embodiments, and is not important for describing the invention.

Clock circuit 29 has a first input terminal for receiving an external clock signal labeled "CLK", a second input terminal, and an output terminal coupled to the second input terminals of both the row address predecoders/latch 24 and the column address predecoders/latch 27 for providing an internal clock signal labeled "K." Note that clock signal K is a differential signal, however, only the true portion of differential clock signal K is illustrated in FIG. 1.

Power-on reset circuit 30 has a first input terminal for receiving bias voltage $N_{BIAS}$, a second input terminal for receiving a bandgap reference voltage labeled "$V_{BG}$", and an output terminal for providing a power-on reset signal labeled "POR".

Data I/O circuits 32 have a first plurality of terminals for providing and for receiving data signals labeled "DATA", and a second plurality of terminals coupled to column logic 28.

To read a data bit from a memory cell, such as memory cell 22, row address ROW ADDRESS is provided to row address buffers 23, and column address COLUMN ADDRESS is provided to column address buffers 26. The row and column addresses are latched in row and column predecoders/latch 24 and 27, respectively, in response to a rising edge of clock signal K, and the latched predecoded row and column addresses are provided to row select 25 and column logic 28 to select a word line and a bit line pair. Word line drivers (not shown) drive the voltage of the word line to a logic high, which selects the row of memory cells. Column logic 28 couples bit line pair BL/BL* to a sense amplifier (not shown). The data bit stored in the selected memory cell exists as a relatively small differential voltage on the pair of complementary bit lines. The sense amplifier detects and amplifies the differential voltage and communicates it to I/O circuits 32.

During a write cycle of memory 20, the flow of data is essentially reversed. Row address ROW ADDRESS is provided to row address buffers 23, and column address COLUMN ADDRESS is provided to column address buffers 26. The row and column addresses are latched in row and column predecoders/latch 24 and 27, respectively, in response to a rising edge of clock signal K, and the latched predecoded row and column addresses are provided to row select 25 and column logic 28 to select a word line and a bit line pair. Word line drivers (not shown) drive the voltage of the word line to a logic high, which selects the row of memory cells. A data signal DATA is provided to I/O circuit 32, which provides a corresponding data signal to a selected bit line pair. A voltage differential is driven onto the selected bit line pair which writes a data bit into the memory cell, such as memory cell 22. At the end of the write cycle the differential voltage on the bit line pair is reduced to a level small enough to prevent data from being erroneously written into a memory cell during the following read cycle. Equalization and precharge (write recovery) of the bit line pairs is achieved by bit line loads 31.

During power-up of memory 20, and before the power supply voltage reaches a predetermined voltage level, power-on reset circuit 30 provides a logic low power-on reset signal POR. The logic low power-on reset signal POR is provided to clock circuit 29, row address predecoders/latch 24, and column address predecoders/latch 27, and causes clock signal K to be provided at an initial predetermined logic state. The predetermined state of clock signal K is then used to turn off transmission gates 142 and 147 in row address predecoders/latch 24 and column address predecoders/latch 27 (shown in FIG. 6), so that the latches can be set in a deselected state to prevent multiple word line selections. By causing clock signal K to be provided at the predetermined logic state, the number of devices needed to control the predecoders/latches is reduced.

Figure 2:
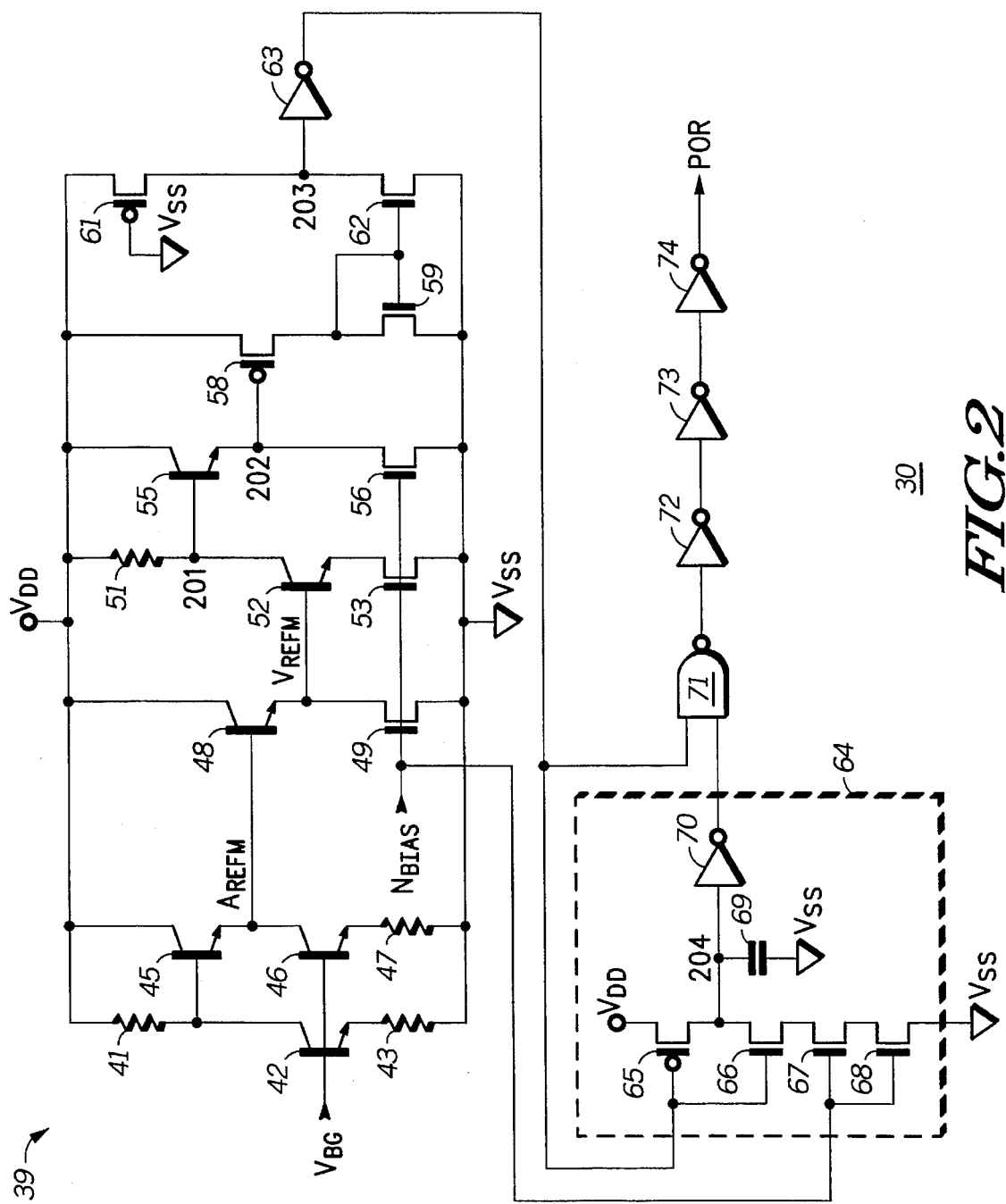
FIG. 2 illustrates in partial schematic diagram form and partial logic diagram form, a power-on reset circuit of the memory of FIG. 1 in accordance with the present invention.

FIG. 2 illustrates in partial schematic diagram form and partial logic diagram form, power-on reset circuit 30 of memory 20 of FIG. 1 in accordance with the present invention. Power-on reset circuit 30 includes DC (direct current) model circuit 39, $N_{BIAS}$ check circuit 64, inverters 63, 72, 73, and 74, and NAND logic gate 71. DC model circuit 39 includes resistors 41, 43, 47, and 51, bipolar NPN transistors 42, 45, 46, 48, 52, and 55, MOS (metal-oxide semiconductor) N-channel transistors 49, 53, 56, 59, and 62, and MOS P-channel transistors 58 and 61. $N_{BIAS}$ check circuit 64 includes P-channel transistor 65, N-channel transistors 66, 67, and 68, capacitor 69, and inverter 70.

Resistor 41 has a first terminal connected to a first power supply voltage terminal labeled "$V_{DD}$", and a second terminal. NPN transistor 42 has a collector connected to the second terminal of resistor 41, a base for receiving bandgap reference voltage $V_{BG}$, and an emitter. Resistor 43 has a first terminal connected to the emitter of NPN transistor 42, and a second terminal connected to a second power supply terminal labeled "$V_{SS}$". NPN transistor 45 has a collector connected to $V_{DD}$, a base connected to the second terminal of resistor 41, and an emitter for providing a reference voltage labeled "$A_{REFM}$". NPN transistor 46 has a collector connected to the emitter of NPN transistor 45, a base for receiving bandgap reference voltage $V_{BG}$, and an emitter. Resistor 47 has a first terminal connected to the emitter of NPN transistor 46, and a second terminal connected to $V_{SS}$. NPN transistor 48 has a collector connected to $V_{DD}$, a base connected to the emitter of NPN transistor 45 for receiving reference voltage $A_{REFM}$, and an emitter for providing a reference voltage labeled "$V_{REFM}$". N-channel transistor 49 has a drain connected to the emitter of NPN transistor 48, a gate for receiving a bias voltage labeled "$N_{BIAS}$", and a source connected to $V_{SS}$. Resistor 51 has a first terminal connected to $V_{DD}$, and a second terminal. NPN transistor 52 has a collector connected to the second terminal of resistor 51, a base connected to the emitter of NPN transistor 48 for receiving reference voltage $V_{REFM}$, and an emitter. N-channel transistor 53 has a drain connected to the emitter of NPN transistor 52, a gate for receiving bias voltage $N_{BIAS}$, and a source connected to $V_{SS}$. NPN transistor 55 has a collector connected to $V_{DD}$, a base connected to the second terminal of resistor 51, and an emitter. N-channel transistor 56 has a drain connected to the emitter of NPN transistor 55, a gate for receiving bias voltage $N_{BIAS}$, and a source connected to $V_{SS}$. P-channel transistor 58 has a source connected to $V_{DD}$, a gate connected to the emitter of NPN transistor 55, and a drain. N-channel transistor 59 has a drain and a gate both connected to the drain of P-channel transistor 58, and a source connected to $V_{SS}$. P-channel transistor 61 has a source connected to $V_{DD}$, a gate connected to $V_{SS}$, and a drain. N-channel transistor 62 has a drain connected to the source of P-channel transistor 61, a gate connected to the gate of N-channel transistor 59, and a source connected to $V_{SS}$. Inverter 63 has an input terminal connected to the drains of both P-channel transistor 61 and N-channel transistor 62, and an output terminal.

P-channel transistor 65 has a source connected to $V_{DD}$, a gate connected to the output terminal of inverter 63, and a drain. N-channel transistor 66 has a drain connected to the drain of P-channel transistor 65, a gate connected to the gate of P-channel transistor 65, and a source. N-channel transistor 67 has a drain connected to the source of N-channel transistor 66, a gate for receiving bias voltage $N_{BIAS}$, and a source. N-channel transistor 68 has a drain connected to the source of N-channel transistor 67, a gate connected to the gate of N-channel transistor 67, and a source connected to $V_{SS}$. Capacitor 69 has a first plate electrode connected to the drains of both P-channel transistor 65 and N-channel transistor 66, and a second plate electrode connected to $V_{SS}$. Inverter 70 has an input terminal connected to the drains of both P-channel transistor 65 and N-channel transistor 66, and an output terminal.

NAND logic gate 71 has a first input terminal connected to the output terminal of inverter 63, a second input terminal connected to the output terminal of inverter 70, and an output terminal. Inverters 72, 73, and 74 are connected in series, where an input terminal of inverter 72 is connected to the output terminal of NAND logic gate 71, and an output terminal of inverter 74 is for providing power-on reset signal POR to clock circuit 29 and to row address predecoders/latch 24 and column address predecoders/latch 27.

In the illustrated embodiment, power supply voltage terminal $V_{DD}$ is coupled to ground potential and power supply voltage terminal $V_{SS}$ receives a negative power supply voltage, for example, −5.0 volts. With a power supply voltage of about −5.0 volts, bias voltage $N_{BIAS}$ is about 1.7 volts above $V_{SS}$, and bandgap reference voltage $V_{BG}$ is about 1.25 volts above $V_{SS}$, which is approximately equal to the bandgap voltage of silicon. However, in other embodiments, $V_{SS}$ may be coupled to ground potential, and a positive power supply voltage applied to $V_{DD}$.

During power-up of memory 20, as the power supply voltage potential between $V_{DD}$ and $V_{SS}$ is increased, bias voltage $N_{BIAS}$ and bandgap reference voltage $V_{BG}$ initially follow the negative power supply voltage applied to $V_{SS}$. NPN transistor 52 is initially non-conductive, and N-channel transistors 49, 53, and 56 are initially non-conductive. Reference voltage $A_{REFM}$ is determined by bandgap reference voltage $V_{BG}$, which controls the conductivity of NPN transistors 42 and 46. The voltage at node 201 is equal to about $V_{DD}$ and the voltage at node 202 is equal to approximately $V_{DD}$ minus one $V_{BE}$ (base-emitter diode voltage drop). P-channel transistor 58 is substantially non-conductive, and N-channel transistors 59 and 62 are substantially non-conductive. P-channel transistor 61 is relatively weak, so as $V_{SS}$ becomes more negative, a voltage at node 203 will increase to the potential of $V_{DD}$, causing a voltage at the output terminal of inverter 63 to be a logic low. The logic low is applied to the first input terminal of NAND logic gate 71, causing the output terminal of NAND logic gate 71 to be a logic high. Thus, power-on reset signal POR is provided as a logic low, indicating that the power supply voltage is inadequate for proper circuit operation.

When the power supply voltage applied to $V_{SS}$ reaches about −4.5 volts, bias voltage $N_{BIAS}$ begins to increase, N-channel transistors 49, 53, and 56 become conductive, reducing the voltage at node 202. When the voltage at node 202 is a P-channel threshold voltage drop ($V_{TP}$) below $V_{DD}$, P-channel transistor 58 becomes conductive, and current flows through P-channel transistor 58 and N-channel transistor 59. N-channel transistors 59 and 62 form a current mirror, so that the current through N-channel transistor 59 is "mirrored" by N-channel transistor 62. The voltage at node 203 is reduced toward $V_{SS}$, causing the voltage at the output terminal of inverter 63 to be a logic high. Bias voltage $N_{BIAS}$ continues to increase to about 1.7 volts above $V_{SS}$. As bias voltage $N_{BIAS}$ increases, N-channel transistors 67 and 68 become conductive. The voltage at node 204 is reduced toward $V_{SS}$. A resistance of N-channel transistors 67 and 68, and a capacitance of capacitor 69 determine the time required for node 204 to be reduced to $V_{SS}$. The output terminal of inverter 70 becomes a logic high, and both input terminals of NAND logic gate 71 are a logic high, causing the output terminal of NAND logic gate 71 to be a logic low. Power-on reset signal POR becomes a logic high, indicating that the power supply voltage is now at the correct level.

Power-on reset circuit monitors the power supply voltage, bias voltage $N_{BIAS}$, and bandgap reference voltage $V_{BG}$, and does not provide a logic high power-on reset signal until all three voltages are at the voltage level required for proper operation of memory 20.

Figure 3:
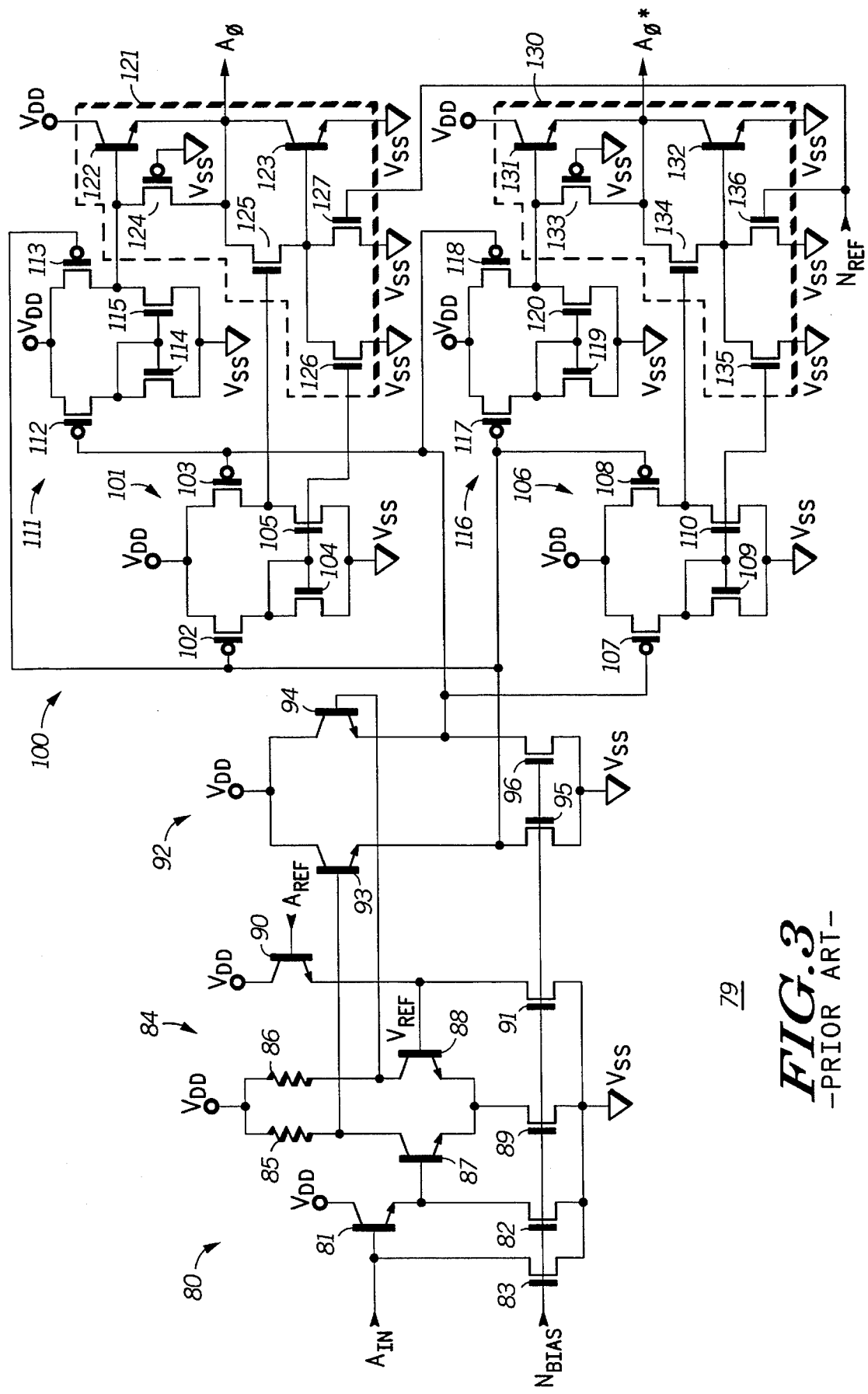
FIG. 3 illustrates in schematic diagram form, a prior art address buffer circuit of the memory of FIG. 1.

FIG. 3 illustrates in schematic diagram form, prior art address buffer circuit 79 of memory 20 of FIG. 1. Address buffer circuit 79 is one address buffer circuit of row address buffers 23 and column address buffers 26. There is one address buffer similar to address buffer circuit 79, located in row address buffers 23 and in column address buffers 26 for each row and column address signal. A DC circuit equivalent of address buffer circuit 79 is modeled by power-on reset circuit 30 in order to compensate for process and temperature variations which may prevent power-on reset circuit 30 from becoming a logic high, or deasserted, before a power supply voltage provided to $V_{DD}$ and $V_{SS}$ have reached the predetermined voltage level.

Address buffer circuit 79 includes ECL (emitter-coupled logic) input stage 80, emitter-follower stage 92, level converter stage 100, and BICMOS drivers 121 and 130. ECL input stage 80 includes NPN transistors 81 and 90, differential amplifier 84, and N-channel transistors 82, 83, and 91. Differential amplifier 84 includes resistors 85 and 86, NPN transistors 87 and 88, and N-channel transistor 89. Emitter-follower stage 92 includes NPN transistors 93 and 94, and N-channel transistors 95 and 96. Level converter stage 100 includes level converter circuits 101, 106, 111, and 116. Lever converter circuit 101 includes P-channel transistors 102 and 103, and N-channel transistors 104 and 105. Lever converter circuit 106 includes P-channel transistors 107 and 108, and N-channel transistors 109 and 110. Level converter circuit 111 includes P-channel transistors 112 and 113, and N-channel transistors 114 and 115. Level converter circuit 116 includes P-channel transistors 117 and 118, and N-channel transistors 119 and 120. BICMOS driver 121 includes NPN transistors 122 and 123, N-channel transistors 125, 126, and 127, and P-channel transistor 124. BICMOS driver 130 includes NPN transistors 131 and 132, N-channel transistors 134, 135, and 136, and P-channel transistor 133.

In ECL input stage 80, NPN emitter-follower transistor 81 has a collector connected to $V_{DD}$, a base for receiving an address signal labeled "$A_{IN}$", and an emitter. N-channel transistor 83 has a drain connected to the base of NPN transistor 81, a gate for receiving bias voltage $N_{BIAS}$, and a source connected to $V_{SS}$. N-channel transistor 82 has a drain connected to the emitter of NPN transistor 81, a gate for receiving bias voltage $N_{BIAS}$, and a source connected to $V_{SS}$. Resistor 85 has a first terminal connected to $V_{DD}$, and a second terminal. Resistor 86 has a first terminal connected to $V_{DD}$, and a second terminal. NPN transistor 87 has a collector connected to the second terminal of resistor 85, a base connected to the emitter of NPN transistor 81, and an emitter. NPN transistor 88 has a collector connected to the second terminal of resistor 86, a base, and an emitter connected to the emitter of NPN transistor 87. N-channel transistor 89 has a drain connected to the emitters of NPN transistors 87 and 88, a gate for receiving bias voltage $N_{BIAS}$, and a source connected to $V_{SS}$. NPN transistor 90 has a collector connected to $V_{DD}$, a base for receiving a reference voltage labeled "$A_{REF}$", and an emitter connected to the base of NPN transistor 88. N-channel transistor 91 has a drain connected to the emitter of NPN transistor 90, a gate for receiving bias voltage $N_{BIAS}$, and a source connected to $V_{SS}$.

In emitter-follower stage 92, NPN transistor 93 has a collector connected to $V_{DD}$, a base connected to the second terminal of resistor 85, and an emitter. N-channel transistor 95 has a drain connected to the emitter of NPN transistor 93, a gate for receiving bias voltage $N_{BIAS}$, and a source connected to $V_{SS}$. NPN transistor 94 has a collector connected to $V_{DD}$, a base connected to the second terminal of resistor 86, and an emitter. N-channel transistor 96 has a drain connected to the emitter of NPN transistor 94, a gate for receiving bias voltage $N_{BIAS}$, and a source connected to $V_{SS}$.

In level converter circuit 101, P-channel transistor 102 has a source connected to $V_{DD}$, a gate connected to the emitter of NPN transistor 93, and a drain. N-channel transistor 104 has a drain and a gate both connected to the drain of P-channel transistor 102, and a source connected to $V_{SS}$. P-channel transistor 103 has a source connected to $V_{DD}$, a gate connected to the emitter of NPN transistor 94, and a drain. N-channel transistor 105 has a drain connected to the drain of P-channel transistor 103, a gate connected to the gate of N-channel transistor 104, and a source connected to $V_{SS}$.

In level converter circuit 106, P-channel transistor 107 has a source connected to $V_{DD}$, a gate connected to the emitter of NPN transistor 94, and a drain. N-channel transistor 109 has a drain and a gate both connected to the drain of P-channel transistor 107, and a source connected to $V_{SS}$. P-channel transistor 108 has a source connected to $V_{DD}$, a gate connected to the emitter of NPN transistor 93, and a drain. N-channel transistor 110 has a drain connected to the drain of P-channel transistor 108, a gate connected to the gate of N-channel transistor 109, and a source connected to $V_{SS}$.

In level converter circuit 111, P-channel transistor 112 has a source connected to $V_{DD}$, a gate connected to the emitter of NPN transistor 94, and a drain. N-channel transistor 114 has a drain and a gate both connected to the drain of P-channel transistor 112, and a source connected to $V_{SS}$. P-channel transistor 113 has a source connected to $V_{DD}$, a gate connected to the emitter of NPN transistor 93, and a drain. N-channel transistor 115 has a drain connected to the drain of P-channel transistor 113, a gate connected to the gate of N-channel transistor 114, and a source connected to $V_{SS}$.

In level converter circuit 116, P-channel transistor 117 has a source connected to $V_{DD}$, a gate connected to the emitter of NPN transistor 93, and a drain. N-channel-transistor 119 has a drain and a gate both connected to the drain of P-channel transistor 117, and a source connected to $V_{SS}$. P-channel transistor 118 has a source connected to $V_{DD}$, a gate connected to the emitter of NPN transistor 94, and a drain. N-channel transistor 120 has a drain connected to the drain of P-channel transistor 113, a gate connected to the gate of N-channel transistor 119, and a source connected to $V_{SS}$.

In BICMOS driver 121, NPN transistor 122 has a collector connected to $V_{DD}$, a base connected to the drain of P-channel transistor 113, and an emitter for providing an address signal labeled "$A_0$". NPN transistor 123 has a collector connected to the emitter of NPN transistor 122, a base, and an emitter connected to $V_{SS}$. P-channel transistor 124 has a source connected to the base of NPN transistor 122, a gate connected to $V_{SS}$, and a drain connected to the emitter of NPN transistor 122. N-channel transistor 125 has a drain connected to the emitter of NPN transistor 122, a gate connected to the drain of P-channel transistor 103, and a source connected to the base of NPN transistor 123. N-channel transistor 126 has a drain connected to the source of N-channel transistor 125, a gate connected to the drain of P-channel transistor 102, and a source connected to $V_{SS}$. N-channel transistor 127 has a drain connected to the base of NPN transistor 123, a gate for receiving a reference voltage labeled "$N_{REF}$", and a source connected to $V_{SS}$.

In BICMOS driver 130, NPN transistor 131 has a collector connected to $V_{DD}$, a base connected to the drain of P-channel transistor 118, and an emitter for providing an address signal labeled "$A_0$*". NPN transistor 132 has a collector connected to the emitter of NPN transistor 131, a base, and an emitter connected to $V_{SS}$. P-channel transistor 133 has a source connected to the base of NPN transistor 131, a gate connected to $V_{SS}$, and a drain connected to the emitter of NPN transistor 131. N-channel transistor 134 has a drain connected to the emitter of NPN transistor 131, a gate connected to the drain of P-channel transistor 108, and a source connected to the base of NPN transistor 132. N-channel transistor 135 has a drain connected to the source of N-channel transistor 134, a gate connected to the drain of P-channel transistor 107, and a source connected to $V_{SS}$. N-channel transistor 136 has a drain connected to the base of NPN transistor 132, a gate for receiving reference voltage $N_{REF}$, and a source connected to $V_{SS}$. Reference voltage $N_{REF}$ is more regulated than the power supply voltage and is equal to approximately the power supply voltage. N-channel transistors 127 and 136 prevent NPN transistors 123 and 132, respectively, from operating in saturation. In other embodiments, the power supply voltage can be used to bias N-channel transistors 127 and 136.

In order to compensate for temperature and process variations, elements of DC model circuit 39 (FIG. 2) model, or mimic, the DC circuit equivalent of address buffer circuit 79 of FIG. 3. For example, reference voltage $A_{REF}$ of address buffer circuit 90 is modeled by reference voltage $A_{REFM}$ provided at the emitter of NPN transistor 45. Likewise, reference voltage $V_{REF}$, provided to the base of NPN transistor 88 is modeled by reference voltage $V_{REFM}$ at the emitter of NPN transistor 48. Resistors 41 43, and 47, and NPN transistors 42, 45, and 46 model the circuit elements that provide reference voltage $A_{REF}$. Note that the actual circuit that provides reference voltage $A_{REF}$ to NPN transistor 90 is not shown. Resistor 51, NPN transistor 52, and N-channel transistor 53 models differential amplifier 84. NPN transistor 55 and N-channel transistor 56 model emitter-follower stage 92. P-channel transistor 58 and N-channel transistor 59 model level converters 101, 106, 111, and 116. P-channel transistor 61 and N-channel transistor 62 model NPN transistors 122, 123, 131, and 132. The layout and size of the elements of DC model circuit 39 are equivalent to the layout and size of the elements of address buffer circuit 79.

Figure 4:
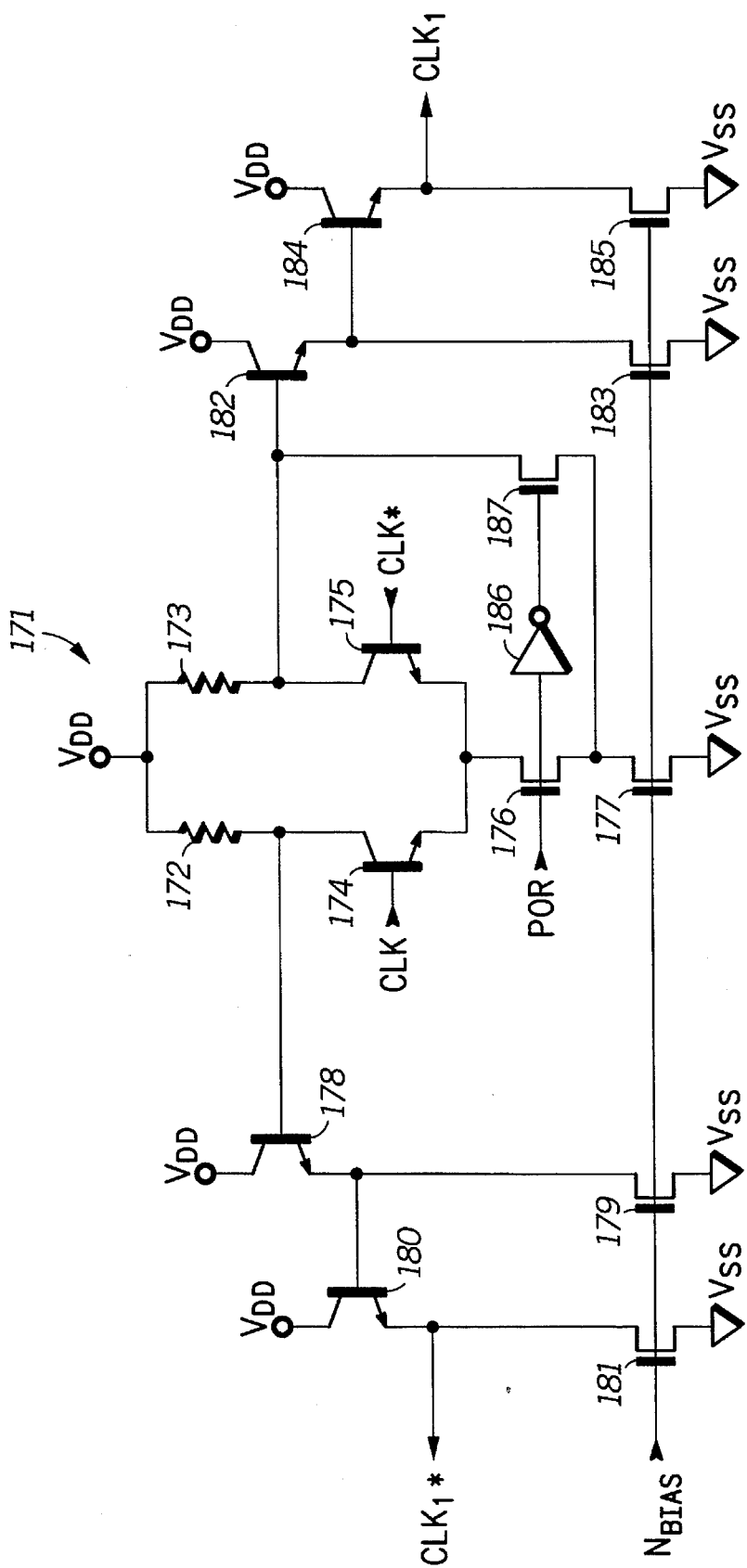
FIG. 4 illustrates in partial schematic diagram form and partial logic diagram form, a clock buffer circuit in accordance with the present invention.

FIG. 4 illustrates in partial schematic diagram form and partial logic diagram form, clock buffer circuit 170 in accordance with the present invention. Clock buffer circuit 170 is part of clock circuit 29 of FIG. 1. Clock buffer circuit 170 includes a conventional differential amplifier 171 and emitter-follower NPN transistors connected to output terminals of differential amplifier 171. Differential amplifier 171 includes resistors 172 and 173 and NPN transistors 174 and 175. N-channel transistors 177, 179, 181, 183, and 185 provide current sources for NPN transistors 174, 175, 178, 180, 182, and 184. N-channel transistor 176 has a gate for receiving power-on reset signal POR, and is coupled between the emitters of NPN transistors 174 and 175 and N-channel transistor 177. Inverter 186 has an input terminal for receiving power-on reset signal POR, and an output terminal. N-channel transistor 187 has a drain connected to the base of NPN transistor 182, a gate connected to the output terminal of inverter 186, and a source connected to the drain of N-channel transistor 177.

Differential clock signals labeled "CLK" and "CLK*" have a relatively small signal swing, and in a preferred embodiment are ECL level clock signals. Differential clock signals CLK and CLK* are provided to the bases of NPN transistors 174 and 175, respectively. In response, differential clock signals "$CLK_1$" and "$CLK_1$*" are provided at the emitters of NPN transistors 184 and 180, respectively. The voltage of clock signal $CLK_1$ is equal to approximately $2V_{BE}$ below the voltage at the collector of NPN transistor 175, and the voltage of clock signal $CLK_1$* is equal to approximately the voltage at the collector of NPN transistor 174 minus $2V_{BE}$.

During power-up of memory 20, power-on reset signal POR is initially provided as a logic low. N-channel transistor 176 is substantially non-conductive, and N-channel transistor 187 is conductive. As the voltage potential between $V_{DD}$ and $V_{SS}$, and bias voltage $N_{BIAS}$ increases, the base of NPN transistor 182 will be reduced toward $V_{SS}$, ensuring that current is steered through NPN transistor 174 instead of NPN transistor 175. This ensures that NPN transistor 182 remains non-conductive, which in turn, causes NPN transistor 184 to be substantially non-conductive, and clock signal $CLK_1$ powers-up as a logic low independent of clock signals CLK/CLK*. Differential clock signals $CLK_1$ and $CLK_1$* are provided to the bases of clock level converter circuit 190 of FIG. 5.

When the power supply voltage reaches the predetermined voltage level, power-on reset signal POR becomes a logic high voltage. N-channel transistor 176 is conductive, thereby providing a current source for differential amplifier 171. N-channel transistor 187 is substantially non-conductive, which allows a voltage at the base of NPN transistor 182 to respond to voltage variations of differential amplifier 171 as clock signals CLK/CLK* toggle.

Figure 5:
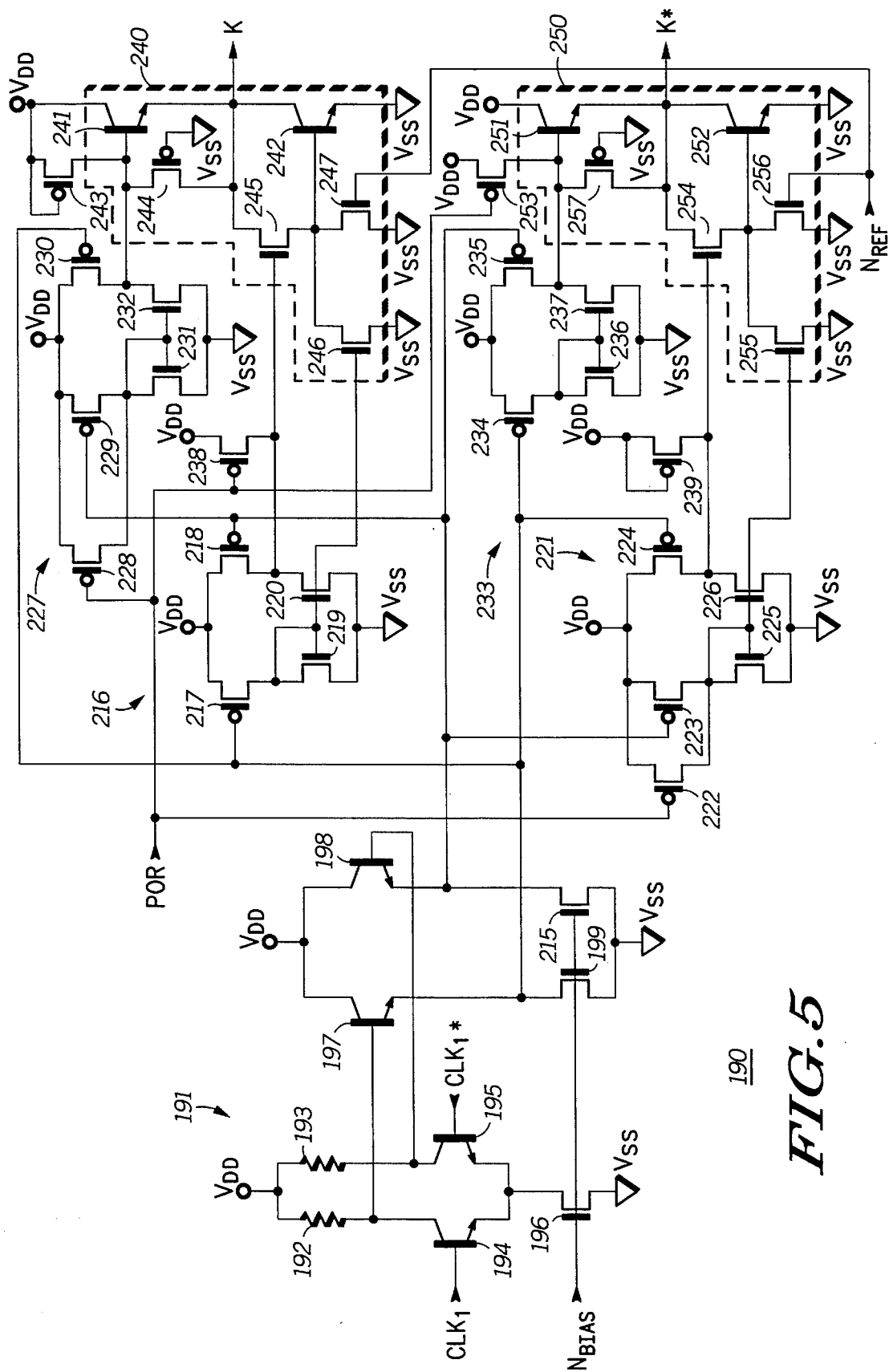
FIG. 5 illustrates in schematic diagram form, a clock level converter circuit in accordance with the present invention.

FIG. 5 illustrates in schematic diagram form, clock level converter circuit 190 in accordance with the present invention. Clock level converter circuit 190 is coupled to clock buffer circuit 170 of FIG. 4, and is part of clock circuit 30 of FIG. 1. Also, clock level converter circuit 190 is similar to address buffer circuit 79 of FIG. 3, except that additional elements are added to clock level converter circuit 190 for receiving power-on reset signal POR and ensuring that differential clock signals labeled "K" and "K*" power-up in a predetermined logic state. Clock level converter circuit 190 includes differential amplifier 191, emitter-follower transistors 197 and 198, level converter circuits 216, 221, 227, and 233, and BICMOS driver circuits 240 and 250. Differential amplifier 191 includes resistors 192 and 193, and NPN transistors 194 and 195. N-channel transistors 196, 199, and 215 provide current sources for NPN transistors 194, 195, 197, and 198. Level converter circuit 216 includes P-channel transistors 217 and 218, and N-channel transistors 219 and 220. Level converter circuit 221 includes P-channel transistors 223 and 224, and N-channel transistors 225 and 226. Level converter circuit 227 includes P-channel transistors 229 and 230, and N-channel transistors 231 and 232. Level converter circuit 233 includes P-channel transistors 234 and 235, and N-channel transistors 236 and 237. BICMOS driver circuit 240 includes NPN transistors 241 and 242, P-channel transistors 243 and 244, and N-channel transistors 245, 246, and 247. BICMOS driver circuit 250 includes NPN transistors 251 and 252, P-channel transistor 252, and N-channel transistors 254, 255, and 256.

P-channel transistor 228 has a source connected to $V_{DD}$, a gate for receiving power-on reset signal POR, and a drain connected to the drain of N-channel transistor 231. P-channel transistor 222 has a source connected to $V_{DD}$, a gate for receiving power-on reset signal POR, and a drain connected to the drain of N-channel transistor 225. Diode connected P-channel transistor 243 has a source and a gate connected to a $V_{DD}$, and a drain connected to the base of NPN transistor 241. Diode connected transistor 239 has a gate and a source connected to $V_{DD}$, and a drain connected to the gate of N-channel transistor 254. P-channel transistor 253 has a source connected to $V_{DD}$, a gate for receiving power-on reset voltage POR, and a drain connected to the base of NPN transistor 251.

Differential clock signals $CLK_1$ and $CLK_1$* are provided by clock buffer circuit 170 of FIG. 4, and are provided to the bases of NPN transistors 194 and 195, respectively. Clock level converter circuit 190 provides CMOS level differential clock signals K and K*. During power-up of memory 20, power-on reset signal POR is provided to clock level converter circuit 190 as a logic low voltage to ensure that clock signal K is initially asserted as a logic low and clock signal K* is initially asserted as a logic high. P-channel transistors 222, 228, 238, and 253 are conductive as the power supply voltage is increased. Current is steered through N-channel transistor 225 in level converter circuit 221, and through N-channel transistor 231 of level converter circuit 227. The voltage at the base of NPN transistor 241 is a logic low, causing clock signal K to be a logic low. The voltage at the base of NPN transistor 251 is high, causing clock signal K* to be a logic high voltage. N-channel transistor 245 is conductive, causing NPN transistor 242 to be conductive, thus reducing the voltage of clock signal K to a logic low. N-channel transistor 254 is substantially non-conductive and N-channel transistor 255 is conductive, ensuring that NPN transistor 252 is substantially non-conductive. When the power supply voltage reaches the proper level, power-on reset signal POR is provided as a logic high voltage, which allows clock signals K/K* to toggle in response to clock signals $CLK_1/CLK_1*$ from clock buffer circuit 170 of FIG. 4.

Figure 6:
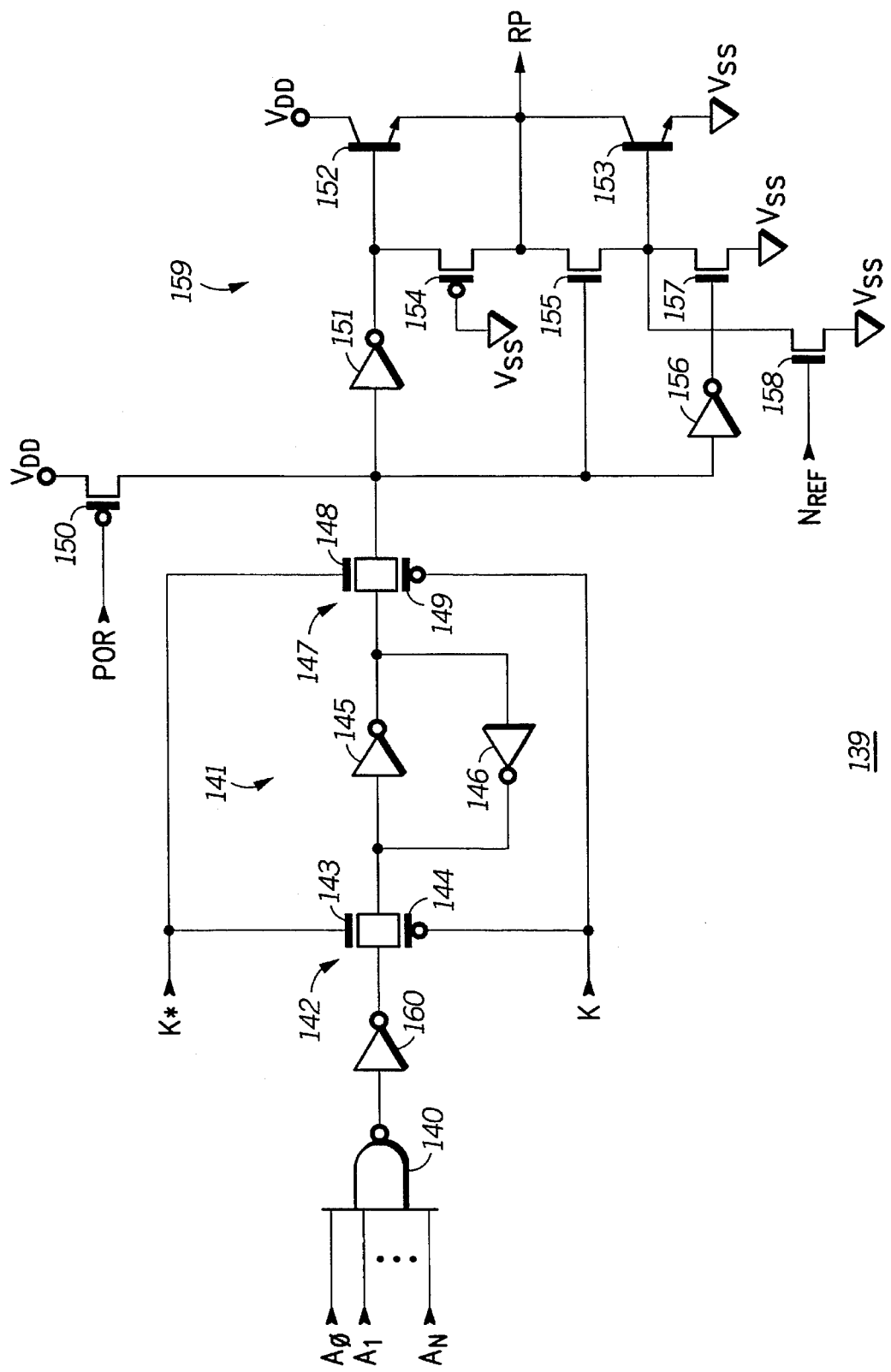
FIG. 6 illustrates in partial schematic diagram form and partial logic diagram form, an address predecoder circuit of the memory of FIG. 1.

FIG. 6 illustrates in partial schematic diagram form and partial logic diagram form, address predecoder circuit 139 of memory 20 of FIG. 1. There is one address predecoder circuit 139 corresponding to each address signal received by row address predecoders/latch 24 and column address predecoders/latch 27. Address predecoder circuit 139 includes NAND logic gate 140, inverter 160, latch 141, transmission gates 142 and 147, P-channel transistor 150, inverter 156, and BICMOS driver circuit 159. Latch 141 includes inverters 145 and 146. BICMOS driver circuit 159 includes inverter 151, NPN transistors 152 and 153, P-channel transistor 154, and N-channel transistors 155, 157, and 158. Transmission gate 142 includes N-channel transistor 143, and P-channel transistor 144. Transmission gate 147 includes N-channel transistor 149, and P-channel transistor 148.

NAND logic gate 140 has a first input terminal for receiving an address signal labeled "$A_0$", a second input terminal for receiving an address signal labeled "$A_1$", a third input terminal for receiving an address signal labeled "$A_N$", and an output terminal. Inverter 160 has an input terminal connected to the output terminal of NAND logic gate 140, and an output terminal. Transmission gate 142 has an input terminal connected to the output terminal of inverter 160, an output terminal, a first control terminal for receiving a clock signal labeled "K*", and a second control terminal for receiving a clock signal labeled "K". Inverter 145 has an input terminal connected to the output terminal of transmission gate 142, and an output terminal. Inverter 146 has an input terminal connected to the output terminal of inverter 145, and an output terminal connected to the input terminal of inverter 145. Transmission gate 147 has an input terminal connected to the output terminal of inverter 145, an output terminal, a first control terminal for receiving clock signal K*, and a second control terminal for receiving clock signal K. Note that while transmission gates 142 and 147 are illustrated as parallel connected N-channel and P-channel transistors, in other embodiments, transmission gates 142 and 147 may have only a single transistor.

P-channel transistor 150 has a source connected to $V_{DD}$, a gate for receiving power-on reset signal POR, and a drain connected to the output terminal of transmission gate 147. Inverter 151 has an input terminal connected to the output terminal of transmission gate 147, and an output terminal. NPN transistor 152 has a collector connected to $V_{DD}$, a base connected to the output terminal of inverter 151, and an emitter for providing a predecoded address signal labeled "RP". P-channel transistor 154 has a source connected to the base of NPN transistor 152, a gate connected to $V_{SS}$, and a drain connected to the emitter of NPN transistor 152. N-channel transistor 155 has a drain connected to the drain of P-channel transistor 154, a gate connected to the output terminal of transmission gate 147, and a source. NPN transistor 153 has a collector connected to the emitter of NPN transistor 152, a base connected to the source of N-channel transistor 155, and an emitter connected to $V_{SS}$. N-channel transistor 157 has a drain connected to the source of N-channel transistor 155, a gate, and a source connected to $V_{SS}$. Inverter 156 has an input terminal connected to the output terminal of transmission gate 147, and an output terminal connected to the gate of N-channel transistor 157. N-channel transistor 158 has a drain connected to the base of NPN transistor 153, a gate for receiving bias voltage $N_{BIAS}$, and a source connected to $V_{SS}$.

During normal operation, buffered, level converted, address signals labeled "$A_0$", "$A_1$", through "$A_N$" are provided by address buffer circuits including address buffer circuit 79 to address predecoder circuits including address predecoder circuit 139. In response to clock signal K becoming a logic low and clock signal K* becoming a logic high, transmission gate 142 is conductive, which couples the output terminal of NAND logic gate 140 to latch 141. Transmission gate 147 is substantially non-conductive, isolating latch 141 from BICMOS driver circuit 159. When clock signals K and K* become a logic high and a logic low, respectively, transmission gate 147 is conductive, coupling latch 141 to BICMOS driver circuit 159, and transmission gate 142 is substantially non-conductive, isolating latch 141 from NAND logic gate 140, thus preventing latch 141 from receiving a new address signal until clock signals K/K* transition to a logic low and logic high, respectively.

During power-up of memory 20, power-on reset signal POR is a logic low, causing P-channel transistor 150 to be conductive, thereby coupling the input terminal of inverter 151 to $V_{DD}$. Inverter 151 provides a logic low to the base of NPN transistor 152, causing NPN transistor 152 to be substantially non-conductive. The gate of N-channel transistor 155 is a logic high, causing N-channel transistor 155 to be conductive. A logic high at the base of NPN transistor 153 causes NPN transistor 153 to be conductive. Because NPN transistor 152 is substantially non-conductive on power-up and NPN transistor 153 is conductive, predecoded address signal RP is initially asserted as a logic low. Also during power-up, clock signal K is a logic low and clock signal K* is a logic high, causing transmission gate 147 to be initially non-conductive, preventing changes in any of address signal $A_0$, $A_1$, or $A_N$ from affecting the logic state of predecoded address signal RP during power-up.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

What is claimed is:

1. An integrated circuit memory, comprising:

a plurality of memory cells organized in rows and columns;

an address buffer circuit for receiving an external address signal and a bias voltage, and in response, providing a buffered address signal;

an address decoding circuit, coupled to the address buffer circuit and to the plurality of memory cells, for selecting a memory cell of the plurality of memory cells in response to receiving the buffered address signal and an internal clock signal;

a clock circuit for providing the internal clock signal; and a power-on reset circuit, coupled to the clock circuit, to a power supply voltage terminal and to the address decoding circuit, the power-on reset circuit for receiving the power supply voltage and the bias voltage, and in response, the power-on reset circuit for setting the internal clock signal to a predetermined logic state and for decoupling the address decoding circuit from the address buffer circuit in response to a power supply voltage being below a predetermined power supply voltage level and for coupling the address decoding circuit to the address buffer circuit in response to the power supply voltage rising above the predetermined power supply voltage level and the bias voltage rising above a predetermined bias level.

2. The integrated circuit memory of claim 1, wherein the address decoding circuit comprises:

a first transmission gate having an input terminal for receiving the buffered address signal, an output terminal, and a control terminal for receiving the internal clock signal;

a latch having an input terminal coupled to the output terminal of the first transmission gate, and an output terminal;

a second transmission gate having an input terminal coupled to the output terminal of the latch, an output terminal, and a control terminal for receiving the internal clock signal;

a driver circuit having an input terminal coupled to the output terminal of the second transmission gate, and an output terminal; and a transistor having a first current electrode coupled to the power supply voltage terminal, a second current electrode coupled to the input terminal of the driver circuit, and a control electrode for receiving a power-on reset signal.

3. The integrated circuit memory of claim 1, wherein the plurality of memory cells is a plurality of static random access memory cells.

4. The integrated circuit memory of claim 1, wherein the power-on reset circuit comprises:

a first circuit, coupled to the power supply voltage terminal for receiving the power supply voltage, the first circuit having a first input terminal for receiving the bias voltage, and an output terminal, the first circuit for compensating for process and temperature variations of the address buffer circuit that affect the predetermined power supply voltage level;

a second circuit having a first input terminal coupled to the output terminal of the first circuit, a second input terminal for receiving the bias voltage, and an output terminal; and a logic gate having a first input terminal coupled to the output terminal of the first circuit, a second input terminal coupled to the output terminal of the second circuit, and an output terminal for providing a power-on reset signal.

5. The integrated circuit memory of claim 4, wherein the first circuit comprises:

a first bipolar transistor having a first current electrode coupled to a first power supply voltage terminal, a second current electrode, and a control electrode for receiving a first reference voltage;

a first MOS transistor having a first current electrode coupled to the second current electrode of the first bipolar transistor, a second current electrode coupled to a second power supply voltage terminal, and a control electrode for receiving the bias voltage;

a first resistive element having a first terminal coupled to the first power supply voltage terminal, and a second terminal;

a second bipolar transistor having a first current electrode coupled to the second terminal of the first resistive element, a second current electrode, and a control electrode coupled to the second current electrode of the first bipolar transistor;

a second MOS transistor having a first current electrode coupled to the second current electrode of the second bipolar transistor, a second current electrode coupled to the second power supply voltage terminal, and a control electrode for receiving the bias voltage;

a third bipolar transistor having a first current electrode coupled to the first power supply voltage terminal, a second current electrode, and a control electrode coupled to the second terminal of the first resistive element;

a third MOS transistor having a first current electrode coupled to the second current electrode of the third bipolar transistor, a second current electrode coupled to the second power supply voltage terminal, and a control electrode for receiving the bias voltage;

a fourth MOS transistor having a first current electrode coupled to the first power supply voltage terminal, a second current electrode, and a control electrode coupled to the second current electrode of the third bipolar transistor;

a fifth MOS transistor having a first current electrode coupled to the first power supply voltage terminal, a second current electrode, and a control electrode coupled to the second power supply voltage terminal; and a current mirror having first and second terminals coupled to the second current electrodes of the fourth and fifth MOS transistors, respectively, and third and fourth terminals coupled to the second power supply voltage terminal.

6. The integrated circuit memory of claim 4, wherein the second circuit comprises:

a first MOS transistor having a first current electrode coupled to a first power supply voltage terminal, a second current electrode, and a control electrode;

a second MOS transistor having a first current electrode coupled to the second current electrode of the first MOS transistor, a second current electrode, and a control electrode coupled to the control electrode of the first MOS transistor;

a third MOS transistor having a first current electrode coupled to the second current electrode of the second MOS transistor, a second current electrode, and a control electrode for receiving the bias voltage;

a fourth MOS transistor having a first current electrode coupled to the second current electrode of the third MOS transistor, a second current electrode coupled to a second power supply voltage terminal, and a control electrode coupled to the control electrode of the third MOS transistor for receiving the bias voltage;

a capacitive element having a first plate electrode coupled to the second terminal of the first MOS transistor, and a second plate electrode coupled to the second power supply voltage terminal; and an inverter having an input terminal coupled to the second terminal of the first MOS transistor, and an output terminal.

7. The integrated circuit memory of claim 4, wherein the logic gate is for performing a NAND logic function.

8. A power-on reset circuit for an integrated circuit, the integrated circuit having first and second power supply voltage terminals for receiving a power supply voltage, and an input terminal for receiving a bias voltage, the power-on reset circuit comprising:

a model circuit, coupled between the first and second power supply voltage terminals, and having an input terminal for receiving the bias voltage, and an output terminal, the model circuit for compensating for process and temperature variations of a circuit of the integrated circuit;

a bias voltage check circuit having a first input terminal for receiving the bias voltage, a second input terminal coupled to the output terminal of the model circuit, and an output terminal, the bias voltage check circuit for determining if the bias voltage has reached a predetermined voltage during power-up of the integrated circuit; and a logic gate having a first input terminal coupled to the output terminal of the model circuit, a second input terminal coupled to the output terminal of the bias voltage check circuit, and an output terminal for providing a power-on reset signal in response to both the bias voltage reaching the predetermined voltage, and the power supply voltage reaching a predetermined power supply voltage level.

9. The power-on reset circuit of claim 8, wherein the integrated circuit is an integrated circuit memory.

10. The power-on reset circuit of claim 9, wherein the logic gate is for performing a NAND logic function.

11. The power-on reset circuit of claim 9, wherein the integrated circuit memory is a static random access memory, comprising:

a plurality of memory cells organized in rows and columns;

an address decoding circuit, coupled to an address buffer circuit and to the plurality of memory cells, for selecting a memory cell of the plurality of memory cells in response to receiving a buffered address signal and an internal clock signal; and a clock circuit for providing the internal clock signal;

wherein the power-on reset circuit is coupled to the clock circuit and to the address decoding circuit, the power-on reset circuit for providing the power-on reset signal during power-up of the static random access memory, the power-on reset circuit for setting the internal clock signal to a predetermined logic state, and for decoupling the address decoding circuit from the address buffer circuit until the bias voltage is at the predetermined voltage and the power supply voltage is at the predetermined power supply voltage level.

12. The power-on reset circuit of claim 11, wherein the address decoding circuit comprises:

a first transmission gate having an input terminal for receiving the buffered address signal, an output terminal, and a control terminal for receiving the internal clock signal;

a latch having an input terminal coupled to the output terminal of the first transmission gate, an output terminal;

a second transmission gate having an input terminal coupled to the output terminal of the latch, an output terminal, and a control terminal for receiving the internal clock signal;

a driver circuit having an input terminal coupled to the output terminal of the second transmission gate, and an output terminal; and a transistor having a first current electrode coupled to the first power supply voltage terminal, a second current electrode coupled to the input terminal of the driver circuit, and a control electrode for receiving the power-on reset signal.

13. The power-on reset circuit of claim 8, wherein the model circuit comprises:

a first bipolar transistor having a first current electrode coupled to the first power supply voltage terminal, a second current electrode, and a control electrode for receiving a reference voltage;

a first MOS transistor having a first current electrode coupled to the second current electrode of the first bipolar transistor, a second current electrode coupled to the second power supply voltage-terminal, and a control electrode for receiving the bias voltage;

a first resistive element having a first terminal coupled to the first power supply voltage terminal, and a second terminal;

a second bipolar transistor having a first current electrode coupled to the second terminal of the first resistive element, a second current electrode, and a control electrode coupled to the second current electrode of the first bipolar transistor;

a second MOS transistor having a first current electrode coupled to the second current electrode of the second bipolar transistor, a second current electrode coupled to the second power supply voltage terminal, and a control electrode for receiving the bias voltage;

a third bipolar transistor having a first current electrode coupled to the first power supply voltage terminal, a second current electrode, and a control electrode coupled to the second terminal of the first resistive element;

a third MOS transistor having a first current electrode coupled to the second current electrode of the third bipolar transistor, a second current electrode coupled to the second power supply voltage terminal, and a control electrode for receiving the bias voltage;

a fourth MOS transistor having a first current electrode coupled to the first power supply voltage terminal, a second current electrode, and a control electrode coupled to the second current electrode of the third bipolar transistor;

a fifth MOS transistor having a first current electrode coupled to the first power supply voltage terminal, a second current electrode, and a control electrode coupled to the second power supply voltage terminal; and a current mirror having first and second terminals coupled to the second current electrodes of the fourth and fifth MOS transistors, respectively, and third and fourth terminals coupled to the second power supply voltage terminal.

14. The power-on reset circuit of claim 8, wherein the bias voltage check circuit comprises:

a first MOS transistor having a first current electrode coupled to the first power supply voltage terminal, a second current electrode, and a control electrode;

a second MOS transistor having a first current electrode coupled to the second current electrode of the first MOS transistor, a second current electrode, and a control electrode coupled to the control electrode of the first MOS transistor;

a third MOS transistor having a first current electrode coupled to the second current electrode of the second MOS transistor, a second current electrode, and a control electrode for receiving the bias voltage;

a fourth MOS transistor having a first current electrode coupled to the second current electrode of the third MOS transistor, a second current electrode coupled to the second power supply voltage terminal, and a control electrode coupled to the control electrode of the third MOS transistor for receiving the bias voltage;

a capacitive element having a first plate electrode coupled to the second terminal of the first MOS transistor, and a second plate electrode coupled to the second power supply voltage terminal; and an inverter having an input terminal coupled to the second terminal of the first MOS transistor, and an output terminal.

15. The power-on reset circuit of claim 8, wherein the reference voltage is a bandgap reference voltage based on the bandgap voltage of silicon.

16. A power-on reset circuit for an integrated circuit memory, comprising:

a first circuit, coupled between first and second power supply voltage terminals for receiving a power supply voltage, the first circuit having an input terminal for receiving a bias voltage, and an output terminal, the first circuit for compensating for process and temperature variations of the circuit of the integrated circuit;

a second circuit having a first input terminal coupled to the output terminal of the first circuit, a second input terminal for receiving the bias voltage, and an output terminal; and a logic gate having a first input terminal coupled to the output terminal of the first circuit, a second input terminal coupled to the output terminal of the second circuit, and an output terminal for providing a power-on reset signal.

17. The integrated circuit memory of claim 16, wherein the first circuit comprises:

a first bipolar transistor having a first current electrode coupled to the first power supply voltage terminal, a second current electrode, and a control electrode for receiving a first reference voltage;

a first MOS transistor having a first current electrode coupled to the second current electrode of the first bipolar transistor, a second current electrode coupled to the second power supply voltage terminal, and a control electrode for receiving the bias voltage;

a first resistive element having a first terminal coupled to the first power supply voltage terminal, and a second terminal;

a second bipolar transistor having a first current electrode coupled to the second terminal of the first resistive element, a second current electrode, and a control electrode coupled to the second current electrode of the first bipolar transistor;

a second MOS transistor having a first current electrode coupled to the second current electrode of the second bipolar transistor, a second current electrode coupled to the second power supply voltage terminal, and a control electrode for receiving the bias voltage;

a third bipolar transistor having a first current electrode coupled to the first power supply voltage terminal, a second current electrode, and a control electrode coupled to the second terminal of the first resistive element;

a third MOS transistor having a first current electrode coupled to the second current electrode of the third bipolar transistor, a second current electrode coupled to the second power supply voltage terminal, and a control electrode for receiving the bias voltage;

a fourth MOS transistor having a first current electrode coupled to the first power supply voltage terminal, a second current electrode, and a control electrode coupled to the second current electrode of the third bipolar transistor;

a fifth MOS transistor having a first current electrode coupled to the first power supply voltage terminal, a second current electrode, and a control electrode coupled to the second power supply voltage terminal; and a current mirror having first and second terminals coupled to the fourth and fifth MOS transistors, respectively, and third and fourth terminals coupled to the second power supply voltage terminal.

18. The integrated circuit memory of claim 16, wherein the second circuit comprises:

a first MOS transistor having a first current electrode coupled to the first power supply voltage terminal, a second current electrode, and a control electrode;

a second MOS transistor having a first current electrode coupled to the second current electrode of the first MOS transistor, a second current electrode, and a control electrode coupled to the control electrode of the first MOS transistor;

a third MOS transistor having a first current electrode coupled to the second current electrode of the second MOS transistor, a second current electrode, and a control electrode for receiving the bias voltage;

a fourth MOS transistor having a first current electrode coupled to the second current electrode of the third MOS transistor, a second current electrode coupled to the second power supply voltage terminal, and a control electrode coupled to the control electrode of the third MOS transistor for receiving the bias voltage;

a capacitive element having a first plate electrode coupled to the second terminal of the first MOS transistor, and a second plate electrode coupled to the second power supply voltage terminal; and an inverter having an input terminal coupled to the second terminal of the first MOS transistor, and an output terminal.

19. The integrated circuit memory of claim 16, wherein the logic gate is for performing a NAND logic function.

* * * * *